(12) United States Patent
Kim

(10) Patent No.: US 6,576,970 B2
(45) Date of Patent: Jun. 10, 2003

(54) BONDING PAD STRUCTURE OF SEMICONDUCTOR DEVICE AND METHOD FOR FABRICATING THE SAME

(75) Inventor: Hyun-Chul Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/020,840

(22) Filed: Dec. 11, 2001

(65) Prior Publication Data
US 2002/0100949 A1 Aug. 1, 2002

(30) Foreign Application Priority Data
Jan. 26, 2001 (KR) .......................................... 2001-3677

(51) Int. Cl.$^7$ ............................................... H01L 31/00
(52) U.S. Cl. ...................... 257/459; 257/698; 257/700; 438/125; 361/795
(58) Field of Search .......................... 361/795; 257/698, 257/700; 438/125

(56) References Cited
U.S. PATENT DOCUMENTS
6,373,717 B1 * 4/2002 Downes et al. ............. 174/255

* cited by examiner

Primary Examiner—David Nelms
Assistant Examiner—Mai-Huong Tran
(74) Attorney, Agent, or Firm—Marger Johnson & McCollom P.C.

(57) ABSTRACT

A bonding pad structure of a semiconductor device has an increased bonding pad height to prevent an increase in mechanical stress caused by a large step difference between a metal pad, exposed through a pad window region, and a protective layer. A misalignment margin is also increased. Preferably, a second metal pad is arranged in direct contact with a first metal pad and a conductive layer pattern such as P-poly pattern. This direct contact is preferably made at an external portion, or outside, of a pad window region, thereby leaving insulation layers between the P-poly pattern and the first metal pad and between the first and second metal pads intact in the pad window regions. According to various aspects of this invention, the height of the bonding pad can be raised as high as the thickness of the remaining insulation layers to reduce mechanical stress on the bonding pad without requiring additional process steps. In addition, the step differences between the metal pad exposed through the pad window region and the protective layer can be reduced, thereby increasing the misalignment margin.

14 Claims, 9 Drawing Sheets

BONDING PAD STRUCTURE OF SEMICONDUCTOR DEVICE AND METHOD FOR FABRICATING THE SAME

This application relies for priority, under 35 U.S.C. §119, on Korean Patent Application 2001-3677, filed Jan. 26, 2001, the contents of which are herein incorporated by reference in their entirety.

BACKGROUND OF THE INVENTION

1. Field of the Invention

The present invention relates to a bonding pad structure of a semiconductor device and to a method for fabricating the same. It is particularly applicable to a wafer-level package such as a micro ball grid array ($\mu$-BGA).

2. Description of Related Art

As electronic devices become smaller and thinner, there is a growing need to develop smaller and thinner packages as well. In keeping with the current tendency, wafer level packages have experienced significant technological progress. This is particularly true with respect to $\mu$-BGA packages, the most commonly used type of wafer level package. In $\mu$-BGA packages, a beam lead is formed on a tape, and a metal capillary is then used in a thermo-sonic process to make a direct stitch bonding to a metal pad. Unfortunately, as a result, the bonding pad is subjected to a great deal of impact during the bonding step.

Thus, when conventional basic bonding pad structures (in which first and second metals are in direct contact) are used for a wafer level package (such as $\mu$-BGA), the mechanical stress applied during the bonding step deteriorates the adhesion between a metal pad and its underlying layer, an inter layer dielectric (ILD). Delamination between these two layers (metal and dielectric) may cause a metal open failure. To solve this problem, in a new bonding pad designed for a DRAM, a polysilicon layer is contacted beneath the first and second metal pads.

FIGS. 1a through 1f are schematic cross-sectional views of a bonding pad structure illustrating a method of fabricating a bonding pad according to one related method. Referring to FIG. 1a, a first interlayer insulating layer 12 is formed and planarized on a semiconductor substrate 10 having a lower structure including field oxide layers, transistors, capacitors, and so on. A conductive layer pattern such as a P-doped polysilicon layer pattern (P-poly pattern) 14 is formed on the interlayer insulating layer 12 and a second interlayer insulating layer 16 is then formed and planarized on the first interlayer insulating layer 12, including the P-poly pattern 14. The P-poly pattern 14 is introduced to prevent delamination between the first interlayer insulating layer 12 and a first metal pad due to deterioration of the adhesive force between them.

Referring to FIG. 1b, the second interlayer insulating layer 16 is selectively etched to expose a region of the P-poly pattern 14 and form a contact hole h. As illustrated by FIG. 1c, a first metal layer, of an aluminum (Al) or copper (Cu) alloy, is deposited on the second interlayer insulating layer 16 including the contact hole h. The first metal layer is then dry-etched to expose a region of the second interlayer insulating layer 16 surrounding the contact hole h and to form the first metal pad 18 contacting the P-poly pattern 14. The P-poly pattern 14, contacting the first metal pad 18, is metalized by metal diffusion.

Referring to FIG. 1d, an inter-metal dielectric (IMD) is formed and planarized on the second interlayer insulating layer 16, including the first metal pad 18, to provide a third interlayer insulating layer 20. In order to provide an electrical connection with a second metal pad that will be formed later, the third interlayer insulating layer 20 is selectively etched to expose a region of the first metal pad 18, thereby forming a via hole V.

Referring to FIG. 1e, a second metal layer of an Al or Cu alloy is deposited onto the third interlayer insulating layer 20 including the via hole V. The second metal layer is dry-etched to expose a region of the third interlayer insulating layer 20 surrounding the via hole V, thereby forming a second metal pad 22. The second metal pad 22 is electrically connected to the first metal pad 18.

Referring to FIG. 1f, a protective layer 24, having an HDP oxide/PE-SiON deposition structure, is formed on the third interlayer insulating layer 20, which includes the second metal pad 22. The protective layer 24 is dry-etched to open a region of the second metal pad 22 to provide a pad window region W (to which the beam lead will be stitch-bonded). As a result, the first metal pad 18 is in contact with the poly pattern 14, and the second metal pad 22 is in contact with the first metal pad 18. The bonding pad structure is then complete.

In this case, the P-poly pattern 14, placed beneath the metal pad, is made of the same material as the metal pad. This is in contrast to the bonding pad structure in which a metal pad is in direct contact with an interlayer insulating layer. This bonding pad structure thereby improves the bonding characteristic of the layered materials. As a result, it reduces the chances of a metal open failure due to delamination in the bonding beam lead. Unfortunately, however, when the bonding pad is designed and fabricated as described above, the height of the bonding pad is decreased. This increases the step difference between the pad metal, exposed through the pad window region W, and the protective layer 24.

Therefore, although a stronger resistance to external mechanical stress is provided by the contact between the poly pattern 14 and the first and second metal pads 18, 22, the mechanical stress applied to the metal pads during the bonding step actually increases. The sidewall becomes higher in inverse proportion to the height of the bonding pad, thereby reducing the beam lead alignment margin. In other words, a significant step difference between the metal pad and the protective layer 24 increases the external mechanical stress applied to the second metal pad during the bonding process of the beam lead. This problem causes significant quality deterioration such as bonding defects, reduction in the assembly characteristics of semiconductor packages, and so on. Therefore, an urgent demand exists for improvements to solve the problem caused by the large step difference in the foregoing bonding pad structure.

SUMMARY OF THE INVENTION

Various aspects and embodiments of the present invention are configured to solve the aforementioned problems. A bonding pad structure according to certain embodiments of the invention, for example, has a greater bonding pad height than the prior art, thereby reducing mechanical stress caused by a step difference between a metal pad and a protective layer and thereby further increasing a misalignment margin.

More particularly, a bonding pad structure of a semiconductor device having multi-layered wires, according to one embodiment of the invention, includes an insulation layer inserted beneath a second metal pad in direct contact with a first metal pad and a lower conductive layer pattern such as P-poly pattern. This configuration increases the height of the bonding pad, without requiring additional process steps. The mechanical stress resulting from a large step difference between a metal pad, exposed through a pad window region, and the protective layer is thus reduced, and a misalignment margin is increased.

According to another aspect of the invention, a contact between the second metal pad, the first metal pad, and the P-poly pattern can be arranged outside the pad window region. The second interlayer insulating layer between the P-poly pattern of the pad window region and the first metal pad is left intact, as well as the third interlayer insulating layer arranged between the first and second metal pads. As a result, the height of the bonding pad at the pad window region increases to the thickness of the remaining layers, thereby reducing a step difference.

The second metal pad is arranged in direct contact with the first metal pad and the P-poly pattern by the insertion of an insulation layer. The contact is made on an external portion of a pad window region, thereby leaving insulation layers between the P-poly pattern and the first metal pad and between the first and second metal pads intact. As a result, the height of the bonding pad is increased to about the thickness of the remaining insulation layers. Mechanical stress applied to the bonding pad is thereby reduced without requiring additional process steps during the packaging process. The step difference between the metal pad and the protective layer, exposed through the pad window region, is also smaller than in the prior art, thereby increasing the misalignment margin.

BRIEF DESCRIPTION OF THE DRAWINGS

A more complete understanding of the nature and objects of the present invention can be obtained through the following detailed description of preferred embodiments, made with reference to the accompanying drawings, in which.

DETAILED DESCRIPTION OF THE INVENTION

Various objects and characteristics of the present invention will be described more fully below with respect to preferred embodiments thereof. FIGS. 2a through 2f are schematic cross-sectional views of a bonding pad structure illustrating a method of fabricating a bonding pad of a semiconductor device in accordance with an embodiment of the present invention.

Figure 1A:
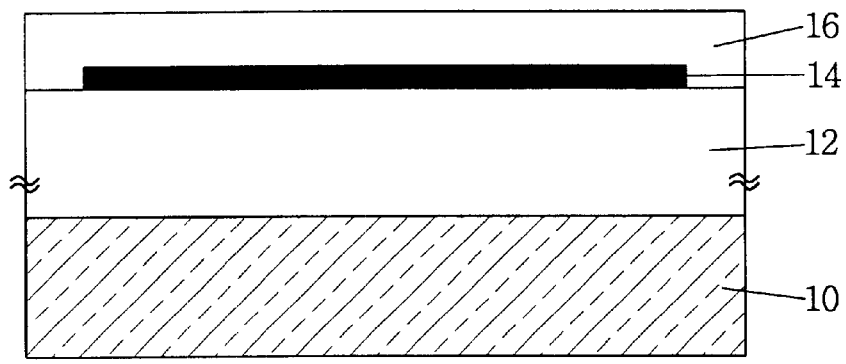
FIGS. 1a through 1f are schematic cross-sectional views of a bonding pad structure illustrating a conventional method of fabricating a bonding pad of a semiconductor device.
Figure 1B:
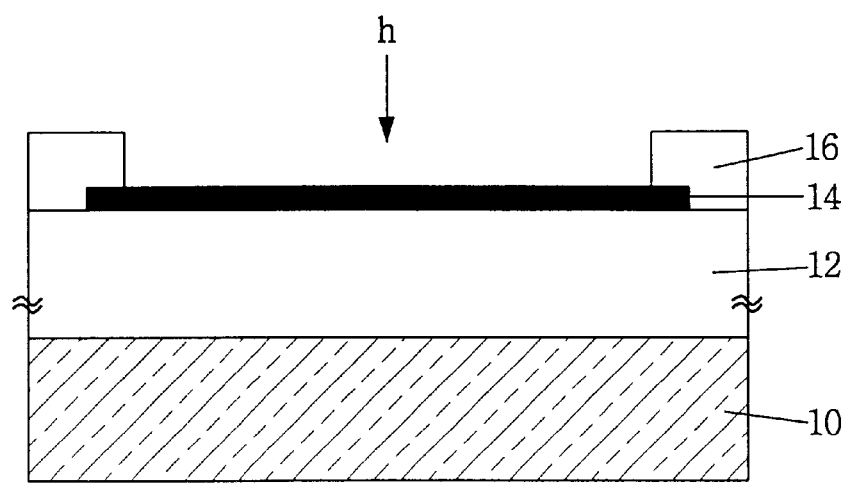
Figure 1C:
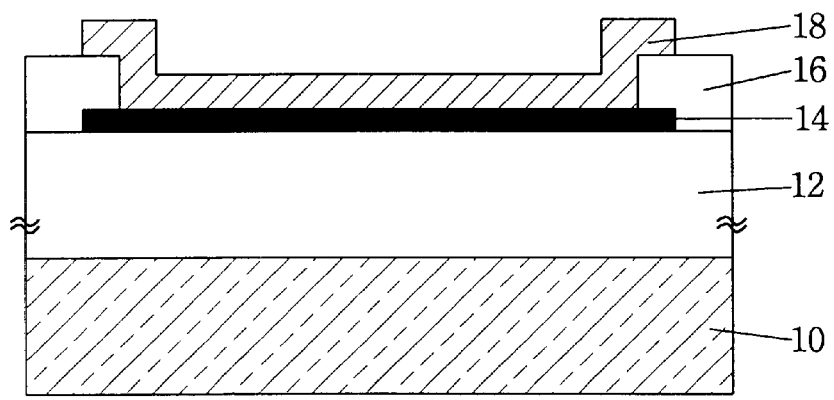
Figure 1D:
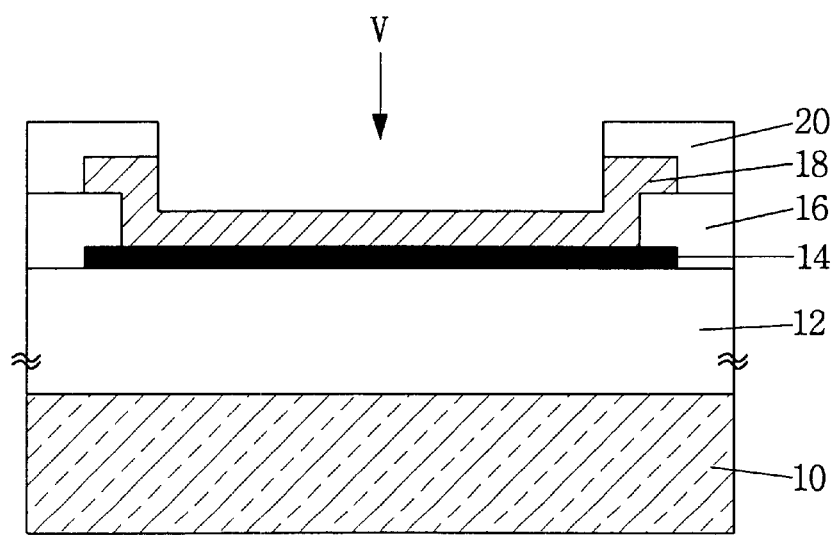
Figure 1E:
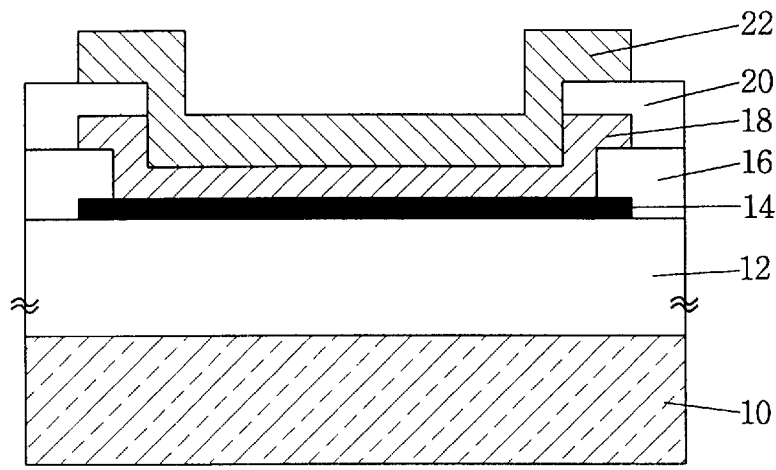
Figure 1F:
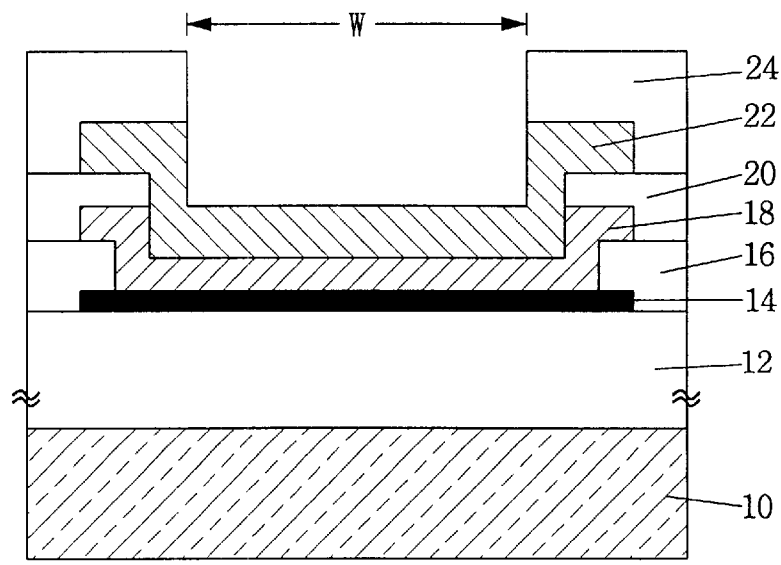
Figure 2A:
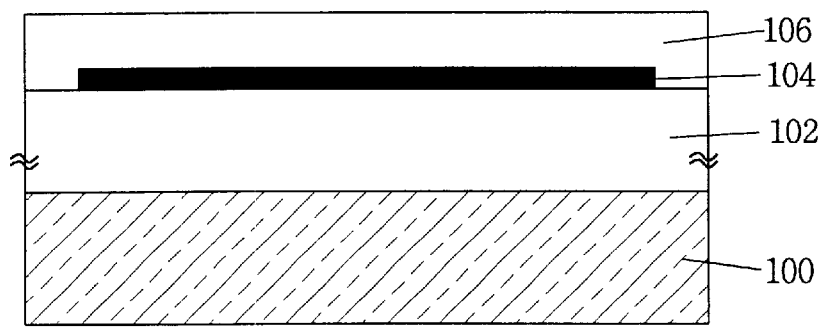
FIGS. 2a through 2f are schematic cross-sectional views of a bonding pad structure illustrating a method of fabricating a bonding pad of a semiconductor device in accordance with an embodiment of the present invention.

Referring to FIG. 2a, a first interlayer insulating layer 102 is formed and planarized on a semiconductor substrate 100. A conductive layer such as a P-doped polysilicon layer pattern ("P-poly pattern") 104 is formed on the interlayer insulating layer 102. A second interlayer insulating layer 106 is then formed and planarized on the first interlayer insulating layer 102, which now includes the P-poly pattern 104. The P-poly pattern 14 prevents delamination between the first interlayer insulating layer 102 and a first metal pad (to be formed later) due to deterioration of the adhesive force between them.

Figure 2B:
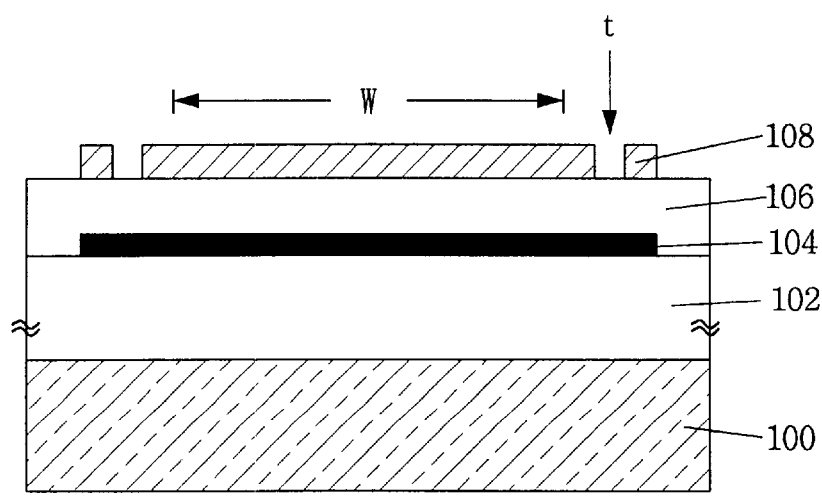

Referring to FIG. 2b, a first metal layer, of an Al or Cu alloy, is deposited on the second interlayer insulating layer 106. The first metal layer is then dry-etched using a mask that exposes a predetermined area on the first metal layer. A first metal pad 108 is thereby formed having a plurality of through holes t. The through holes t expose a region of the second interlayer insulating layer 106 that surrounds a pad window region W over the P-poly pattern 104. The first metal pad 108 is formed simultaneously in conjunction with a wiring process (e.g., a first metal wiring). In this embodiment, the first metal pad 108 is preferably formed having the same size as the P-poly pattern 104. Each of the through holes t are preferably formed as either a slit or a contact hole.

Figure 2C:
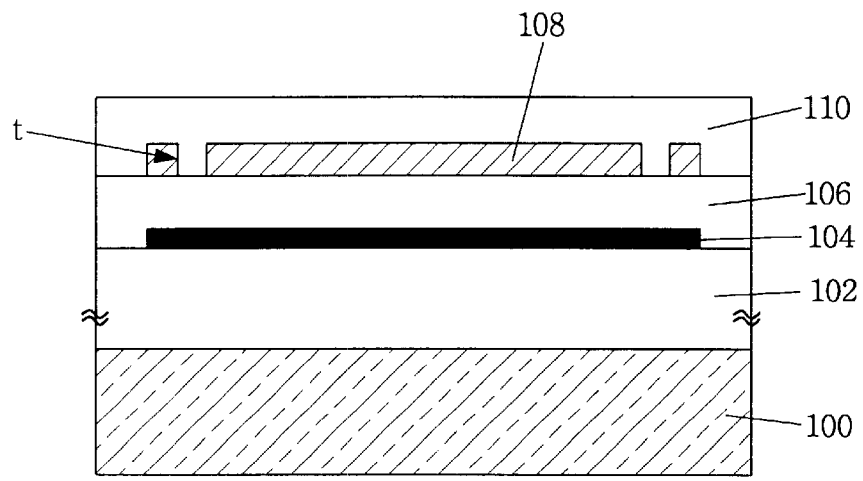
Figure 2D:
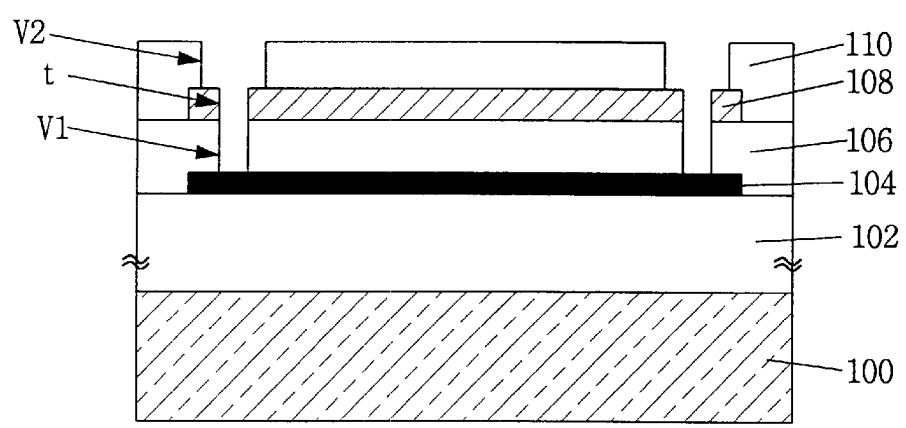

Referring now to FIG. 2c, a third interlayer insulating layer 110 is formed on the second interlayer insulating layer 106 including the first metal pad 108. Then, as illustrated in FIG. 2d, the third interlayer insulating layer 110 is selectively etched to form second via holes V2. The second via holes V2 expose a region of the first metal pad 108 including the through holes t. The first metal pad 108 is used as an etch stop layer when etching the third interlayer insulating layer 110. The first metal pad 108, exposed through the via holes V2, is then used as a mask to selectively etch the second interlayer insulating layer 106 below the through holes t to expose a region of the P-poly pattern 104. First via holes V1 are thereby formed through the interlayer insulating layer 106 below the through holes t. The P-poly pattern 104 is used as an etch stop layer when etching the second interlayer insulating layer 106. The first via holes V1 are formed in the shape of a slit or a contact hole.

Figure 2E:
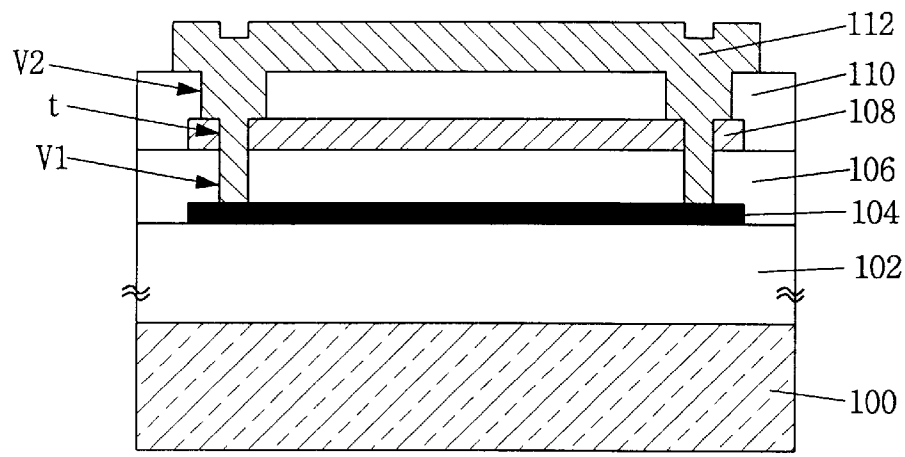

Referring to FIG. 2e, a second metal layer of an Al or Cu alloy is deposited on the third interlayer insulating layer 110 filling the via holes V1, V2 and the through holes t. The second metal layer is then selectively etched to form a second metal pad 112. The second metal pad 112, while disposed on the third interlayer insulating layer 110, is also arranged in direct contact with the first metal pad 108 and the P-poly pattern 104. The second metal pad 112 is preferably formed while manufacturing multi-layered wires (e.g., the second metal wiring). Since the P-poly pattern 104, arranged in contact with the second metal pad 112, is metalized by metal diffusion, improved adhesion is provided.

Figure 2F:
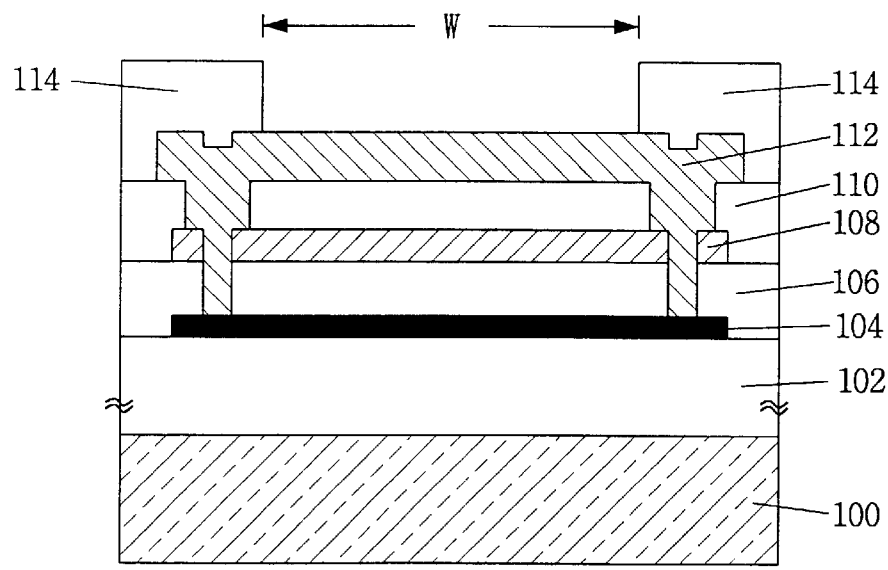

Referring now to FIG. 2f, a protective layer 114, preferably having an HDP oxide/PE-SiON deposition structure, is formed on the third interlayer insulating layer 110, which now includes the second metal pad 112. The protective layer 114 is dry-etched to expose a region of the second metal pad 112 to be used as a pad window region W, to which the beam lead is stitch bonded. The bonding pad structure is then complete.

In summary, a bonding pad structure according to this embodiment of the present invention includes a P-poly pattern 104 formed on a first interlayer insulating layer 102, and a second interlayer insulating layer 106 formed on the first interlayer insulating layer 102 and P-poly pattern 104. A plurality of first via holes V1 expose a region of the P-poly pattern 104 surrounding a pad window region W. A first metal pad 108 is formed on the second interlayer insulating layer 106 over the P-poly pattern 104, along with through holes t to provide an integral connection with the first via holes V1. A third interlayer insulating layer 110 is formed on the second interlayer insulating layer 106 and the first metal pad 108. Second via holes V2 provide an integral connection to the through holes t. The second metal pad 112 is formed on the third interlayer insulating layer 110 over the P-poly pattern 104 to be electrically connected to the P-poly pattern 104 and the first metal pad 108 through the first and second via holes V1, V2 and the through holes t. A protective layer 114 is formed on the third interlayer insulating layer 110 and second metal pad 112 and exposes a surface of the second metal pad 112 through the pad window region W. As described above, the second metal pad 112 is arranged in direct contact with the first metal pad 108 and the P-poly pattern 104.

In this particular embodiment, the second via holes V2 are bigger than the first via holes V1. The semiconductor substrate 100 includes transistors, capacitors, resistors, and other circuit elements. The P-poly pattern 104 is a conductive layer fabricated simultaneously along with the formation of resistors or capacitor electrodes. And the first and second metal pads 108, 112 are conductive layers simultaneously formed with multi-layered wires (e.g., first and second metal wirings). Further according to this embodiment, the contacts between the second metal pad 112 and the first metal pad 108, and between the second metal pad 112 and the P-poly pattern 104 preferably occur outside the pad window region W, so that the second and third interlayer insulating layers 106, 110 remain within the pad window region.

By forming contact holes and via holes, the height of the bonding pad at the pad window region W may be increased as high as the remaining insulation layers allow. As a result, the step difference between the second metal pad 112, exposed by the pad window region W, and the protective layer 114 is decreased as compared to the prior art. Mechanical stress caused by low step difference is thereby reduced and a beam lead alignment margin is increased.

In accordance with another embodiment of the present invention, the first metal pad is formed without through holes and has a size that is smaller than that of the P-poly pattern. An additional interlayer insulating layer is provided, and the second metal pad is formed in direct contact with the first metal pad and the P-poly pattern through via holes. FIGS. 3a through 3f are schematic cross-sectional views illustrating a method of forming a bonding pad according to this embodiment of the invention. In the following description, the features that are the same as those in the earlier-described embodiment will not be further described in detail. A detailed description will be made, however, with respect to those features that are different than the earlier-described embodiment.

Figure 3A:
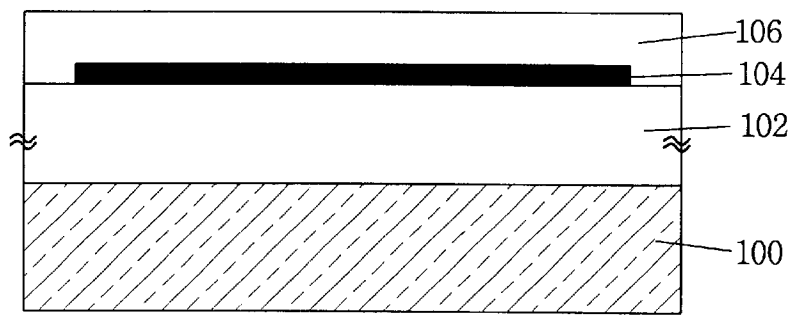
FIGS. 3a through 3f are schematic cross-sectional views of a bonding pad structure illustrating a method of fabricating a bonding pad of a semiconductor device in accordance with another embodiment of the present invention.

Referring to FIG. 3a, a first interlayer insulating layer 102 is formed and planarized on a semiconductor substrate 100 including a field oxide layer, a transistor, a capacitor, and so on. A P-poly pattern 104 is formed on the interlayer insulating layer 102. A second interlayer insulating layer 106 is then formed and planarized on the first interlayer insulating layer 102 including the poly pattern 104.

Figure 3B:
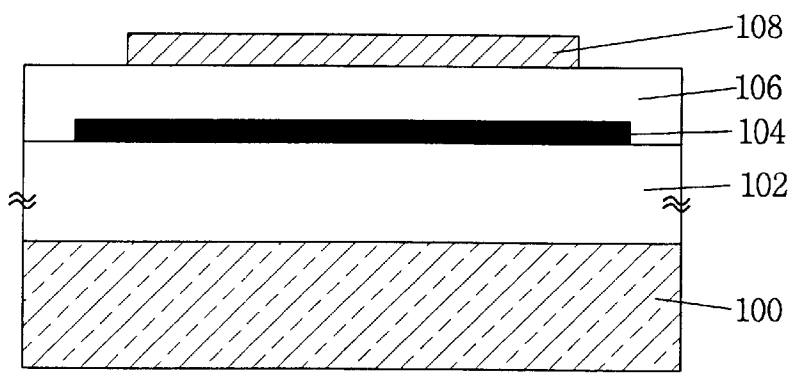
Figure 3C:
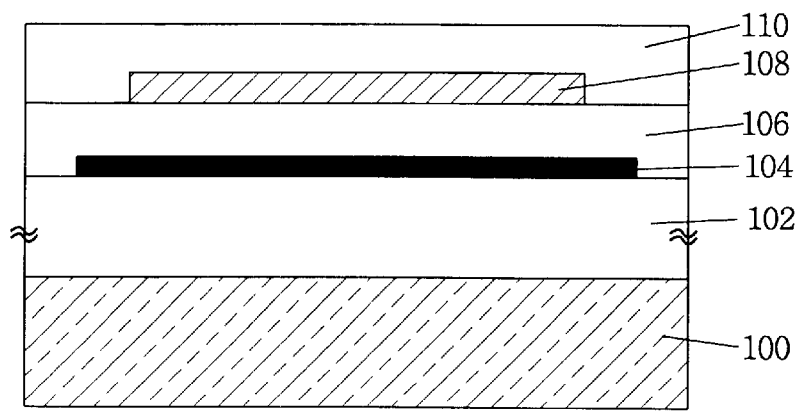

Referring to FIG. 3b, a first metal pad 108 is formed on the second interlayer insulating layer 106 over the P-poly pattern 104. In this embodiment, the first metal pad 108 is smaller than the P-poly pattern 104. As illustrated in FIG. 3c, a third interlayer insulating layer 110 is then formed on the second interlayer insulating layer 106 including the first metal pad 108.

Figure 3D:
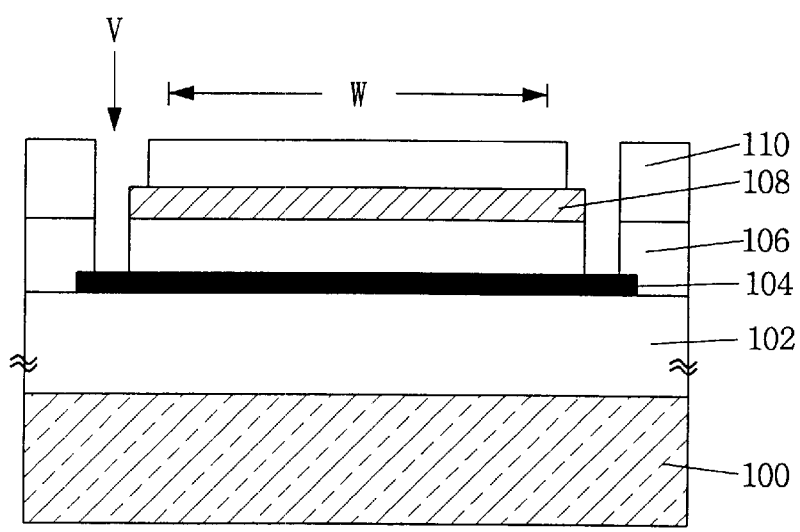

Referring now to FIG. 3d, the third and second interlayer insulating layers 110, 106 are selectively etched to form via holes V that penetrate these insulation layers 110, 106. Both ends of the first metal pad 108, surrounding the pad window region W, and a region of the P-poly pattern 104 are exposed through the via holes V. The first metal pad 108 functions as an etch-stop layer during the etching of the third interlayer insulating layer 110. The P-poly pattern 104 functions as an etch-stop layer when etching the second interlayer insulating layer 106.

Figure 3E:
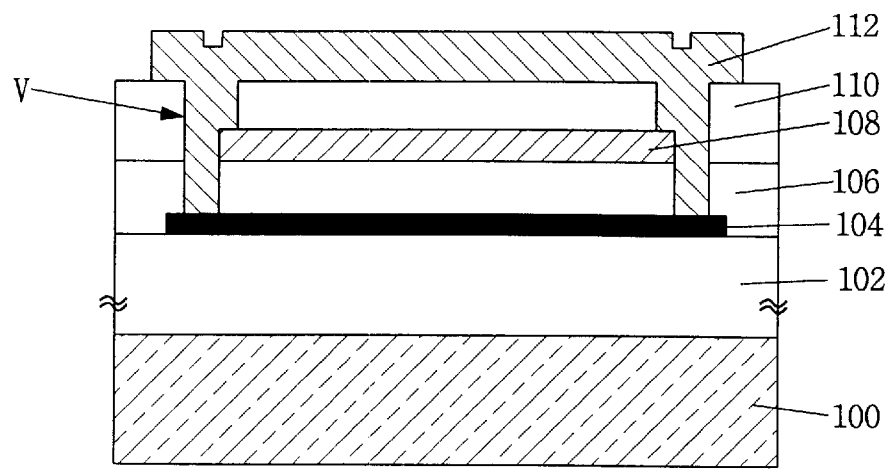
Figure 3F:
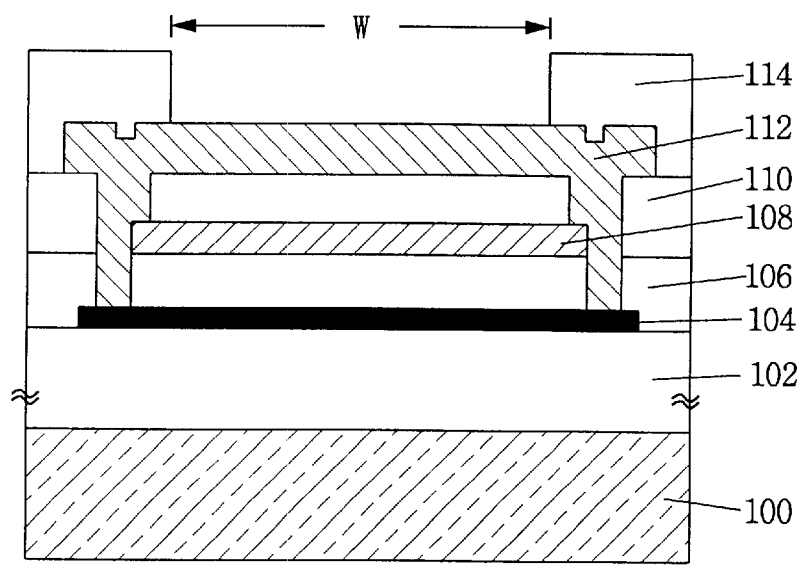

Referring to FIG. 3e, a second metal pad 112 is formed on the third interlayer insulating layer 110 over the P-poly pattern 104. The second metal pad 112 is connected with the P-poly pattern 104 and the first metal pad 108 through via holes V. Referring to FIG. 3f, a protective layer 114 having an HDP oxide/PE-SiON deposition structure is formed over the third insulation layer 110 and the second metal pad 112 with a region of the second metal pad 112 being exposed through the pad window region W.

In summary, according to this embodiment, the P-poly pattern 104 is formed on a surface of the first interlayer insulating layer 102, and the second interlayer insulating layer 106 is formed on the first interlayer insulating layer 102 and P-poly pattern 104. The first metal pad 108, which is smaller than the P-poly pattern 104, is formed on the second interlayer insulating layer 106 over the P-poly pattern 104. The third interlayer insulating layer 110 is formed on the first metal pad 108 and on the region of the second interlayer insulating layer 106 not covered by the first metal pad 108. The second and third interlayer insulating layers 106, 110, surrounding the pad window region W, are penetrated with via holes V to expose both ends of the first metal pad 108 and the surface of the P-poly pattern 104. The second metal pad 112 is formed on the third interlayer insulating layer 110 and fills the via holes V to contact both the P-poly pattern 104 and the first metal pad 108. A protective layer 114 is formed on the third interlayer insulating layer 110 and the part of the second metal pad 112 outside of the pad window region W.

The second embodiment is different from the first embodiment in that the second metal pad 112 is in direct contact with the first metal pad 108 and the P-poly pattern 104 and the second and third interlayer insulating layers 106, 110 remain within the pad window region W. Similar to the earlier embodiment, however, this embodiment also increases the height of the bonding pad, thereby reducing mechanical stress and increasing the beam lead alignment margin.

As described above, the present invention provides advantages over the prior art. The bonding pad is designed having a structure in which the second metal pad is in direct contact with the first metal pad and the P-poly pattern. This contact is preferably made at the external part of, or outside of, a pad window region, thereby leaving insulation layers in the bonding pad parts. The height of the bonding pad is thereby raised up to the thickness of the remaining insulation layers. This results in reduced mechanical stress on the bonding pad without requiring additional process steps in the packaging process. Also, the step difference between the pad metal and the protective layer, exposed through the pad window region, is reduced, thereby increasing the misalignment margin.

Having described and illustrated the principles of the invention in various embodiments thereof, it should be apparent to those skilled in the art that the invention can be modified in arrangement and detail without departing from such principles. The claims should therefore be interpreted to cover all modifications and variations coming within the spirit and scope of the present invention.

What is claimed is:

1. A bonding pad of a semiconductor device comprising:
   a first interlayer insulating layer formed on a semiconductor substrate;
   a conductive layer pattern formed on a region of the first interlayer insulating layer;
   a second interlayer insulating layer formed on the first interlayer insulating layer and on the conductive layer pattern;
   a first metal pad formed on the second interlayer insulating layer, the first metal pad overlying the conductive layer pattern;
   a third interlayer insulating layer formed on the second interlayer insulating layer and on the first metal pad;
   a second metal pad formed on the third interlayer insulating layer, wherein the second metal pad is arranged in direct contact with the first metal pad and the conductive layer pattern; and
   a protective layer formed on the third interlayer insulating layer and on the second metal pad, wherein a pad window region is formed through the protective layer to expose a region of the second metal pad.

2. A bonding pad according claim 1, wherein the conductive layer pattern is a P-poly pattern and wherein the first metal pad is approximately the same size as the P-poly pattern.

3. A bonding pad according to claim 1, wherein:
   a region of the second metal pad penetrates through the third interlayer insulating layer, the first metal pad, and the second interlayer insulating layer to connect with the conductive layer pattern; and
   the second metal pad is arranged above the conductive layer pattern and has a width equal to or greater than the conductive layer pattern.

4. A bonding pad according to claim 3, wherein the region of the second metal pad penetrating through said third insulation layer, said first metal pad, and said second interlayer insulating layer is arranged outside the pad window region; and wherein said pad window region is smaller than the conductive layer pattern.

5. A bonding pad according to claim 1, wherein the protective layer comprises an HDP oxide/PE-SiON deposition structure.

6. A bonding pad according to claim 1, wherein the first and second metal pads are formed concurrently with multi-layered wires for a semiconductor device.

7. A bonding according to claim 1, wherein the first metal pad is smaller than the conductive layer pattern.

8. A bonding pad according to claim 1, wherein:
   a portion of the second metal pad extends through the third interlayer insulating layer and the second interlayer insulating layer to connect with the conductive layer pattern;
   the second metal pad has a width equal to or greater than the conductive layer pattern; and
   the second metal pad is arranged above the conductive layer pattern.

9. A bonding pad according to claim 8, wherein:
   the portion of the second metal pad extending through said third insulation layer and said second interlayer insulating layer is arranged outside a pad window region; and
   said pad window region has a width less than that of the conductive layer pattern.

10. A semiconductor device comprising:
    a semiconductor substrate; and
    a bonding pad comprising:
      a first interlayer insulating layer formed on the semiconductor substrate;
      a conductive layer pattern formed on a region of the first interlayer insulating layer;
      a second interlayer insulating layer formed on the first interlayer insulating layer and on the conductive layer pattern;
      a first metal pad formed on the second interlayer insulating layer, the first metal pad overlying the conductive layer pattern;
      a third interlayer insulating layer formed on the second interlayer insulating layer and on the first metal pad;
      a second metal pad formed on the third interlayer insulating layer, wherein the second metal pad is arranged in direct contact with the first metal pad and the conductive layer pattern; and
      a protective layer formed on the third interlayer insulating layer and on the second metal pad, wherein a pad window region is formed through the protective layer to expose a region of the second metal pad.

11. A semiconductor device according to claim 10 wherein the conductive layer pattern of the bonding pad is a P-poly pattern and wherein the first metal pad is approximately the same size as the P-poly pattern.

12. A semiconductor device according to claim 10 wherein:
    the second metal pad is arranged above the conductive layer pattern and has a width equal to or greater than the conductive layer pattern;
    a portion of the second metal pad penetrates through the third interlayer insulating layer, the first metal pad, and the second interlayer insulating layer to connect with the conductive layer pattern outside the pad window region; and
    said pad window region is smaller than the conductive layer pattern.

13. A semiconductor device according to claim 10, wherein:
    a region of the second metal pad extends through the third interlayer insulating layer and the second interlayer insulating layer to connect with the conductive layer pattern;
    the second metal pad has a width equal to or greater than the conductive layer pattern; and
    the second metal pad is arranged above the conductive layer pattern.

14. A semiconductor device according to claim 13, wherein:
    the region of the second metal pad extending through said third insulation layer and said second interlayer insulating layer is arranged outside a pad window region; and
    said pad window region has a width less than that of the conductive layer pattern.

* * * * *